United States Patent
Tominaga et al.

(10) Patent No.: US 11,556,177 B2
(45) Date of Patent: Jan. 17, 2023

(54) VIBRATION DEVICE

(71) Applicant: Murata Manufacturing Co., Ltd., Nagaokakyo (JP)

(72) Inventors: Toru Tominaga, Nagaokakyo (JP); Takashi Kihara, Nagaokakyo (JP); Hidekazu Kano, Nagaokakyo (JP); Jun Endo, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/238,852

(22) Filed: Apr. 23, 2021

(65) Prior Publication Data

US 2021/0240272 A1    Aug. 5, 2021

Related U.S. Application Data

(63) Continuation of application No. PCT/JP2020/015667, filed on Apr. 7, 2020.

(30) Foreign Application Priority Data

Apr. 19, 2019  (JP) .............................. JP2019-080107

(51) Int. Cl.
| | | |
|---|---|---|
| G08B 6/00 | (2006.01) | |
| G06F 3/01 | (2006.01) | |
| B06B 1/06 | (2006.01) | |
| G06F 3/0354 | (2013.01) | |
| H01L 41/193 | (2006.01) | |

(52) U.S. Cl.
CPC ............ *G06F 3/016* (2013.01); *B06B 1/0688* (2013.01); *G06F 3/03547* (2013.01); *H01L 41/193* (2013.01)

(58) Field of Classification Search
CPC ...... G06F 3/016; G06F 3/03547; G06F 3/041; B06B 1/0688; H01L 41/193; H03H 9/17
See application file for complete search history.

(56) References Cited

U.S. PATENT DOCUMENTS

| | | |
|---|---|---|
| 9,678,592 B2 | 6/2017 | Takeuchi |
| 2012/0068965 A1 | 3/2012 | Wada et al. |
| 2013/0201138 A1 | 8/2013 | Kono et al. |
| 2015/0160771 A1 | 6/2015 | Takeuchi |

(Continued)

FOREIGN PATENT DOCUMENTS

| | | |
|---|---|---|
| JP | 2012027860 A | 2/2012 |
| JP | 2012064108 A | 3/2012 |

(Continued)

OTHER PUBLICATIONS

Japanese Office Action issued for Japanese Application No. 2021-514896, Japanese Office Action dated Apr. 12, 2022.

(Continued)

Primary Examiner — Toan N Pham
(74) Attorney, Agent, or Firm — ArentFox Schiff LLP

(57) ABSTRACT

A vibration device that includes a vibration unit that has a vibrator which vibrates in a plane direction; and a sensor arranged on at least a portion of the vibration unit around the vibrator in a plan view of the vibration unit, and the sensor is constructed to detect a pressing operation in a direction normal to a pressing surface of the vibration device.

15 Claims, 8 Drawing Sheets

(56) References Cited

U.S. PATENT DOCUMENTS

| | | | |
|---|---|---|---|
| 2017/0329427 A1* | 11/2017 | Kozasa | .................... H01G 7/02 |
| 2019/0155391 A1 | 5/2019 | Hashimoto et al. | |
| 2020/0284815 A1* | 9/2020 | Ogura | ................... H01L 41/053 |
| 2020/0292314 A1* | 9/2020 | Nishizawa | ......... G01C 19/5663 |
| 2020/0309526 A1* | 10/2020 | Nishizawa | ......... G01C 19/5705 |

FOREIGN PATENT DOCUMENTS

| | | |
|---|---|---|
| JP | 2014202618 A | 10/2014 |
| JP | 2015114816 A | 6/2015 |
| JP | 2016219804 A | 12/2016 |
| WO | 2019013164 A1 | 1/2019 |

OTHER PUBLICATIONS

International Search Report issued for PCT/JP2020/015667, dated Jun. 30, 2020.
Written Opinion of the International Searching Authority issued for PCT/JP2020/015667, dated Jun. 30, 2020.

* cited by examiner

VIBRATION DEVICE

CROSS REFERENCE TO RELATED APPLICATIONS

The present application is a continuation of International application No. PCT/JP2020/015667, filed Apr. 7, 2020, which claims priority to Japanese Patent Application No. 2019-080107, filed Apr. 19, 2019, the entire contents of each of which are incorporated herein by reference.

FIELD OF THE INVENTION

The present invention relates to a vibration device that causes vibration.

BACKGROUND OF THE INVENTION

In recent years, in an input device such as a touch panel, a tactile presentation device has been proposed which makes a user feel a response that he/she has pushed on the input device by transmitting vibration when the user performs a push operation.

For example, Patent Document 1 has proposed a tactile presentation device that gives tactile feedback to a user using a film 12. In Patent Document 1, the film 12 is deformed in a plane direction by a voltage being applied thereto. Due to the expansion and contraction of the film 12, a vibrating portion 14 connected to the film 12 vibrates in the plane direction.

Patent Document 1: International Publication No. 2019/013164

SUMMARY OF THE INVENTION

In a case where the tactile presentation device has a function of detecting a pressing operation, it is necessary to add a press sensor that detects deformation in a direction normal to the pressed surface of the press sensor, for example. In this case, since the sensor receives force in the normal direction, if the sensor overlaps with a vibrator vibrating in the plane direction, the movement of the vibrator may be inhibited. Therefore, it is necessary to make sure that the vibration of the vibrating portion is not inhibited by the press sensor.

Therefore, an object of the present invention is to provide a vibration device capable of detecting deformation in the normal direction without inhibiting vibration.

A vibration device according to an aspect of the invention includes a vibration unit that has a vibrator which vibrates in a plane direction; and a sensor arranged on at least a portion of the vibration unit around the vibrator in a plan view of the vibration unit, and the sensor is constructed to detect a pressing operation in a direction normal to a pressing surface of the vibration device.

In this configuration, the vibrator and the sensor do not overlap in the plan view. Therefore, even if the sensor receives force in the normal direction, the pushed portion is not a portion where the vibrating vibrator is located. Accordingly, the sensor can detect the deformation in the normal direction without inhibiting the vibration.

According to the invention, it is possible to detect the deformation in the normal direction without inhibiting the vibration.

DETAILED DESCRIPTION OF THE INVENTION

Figure 1:
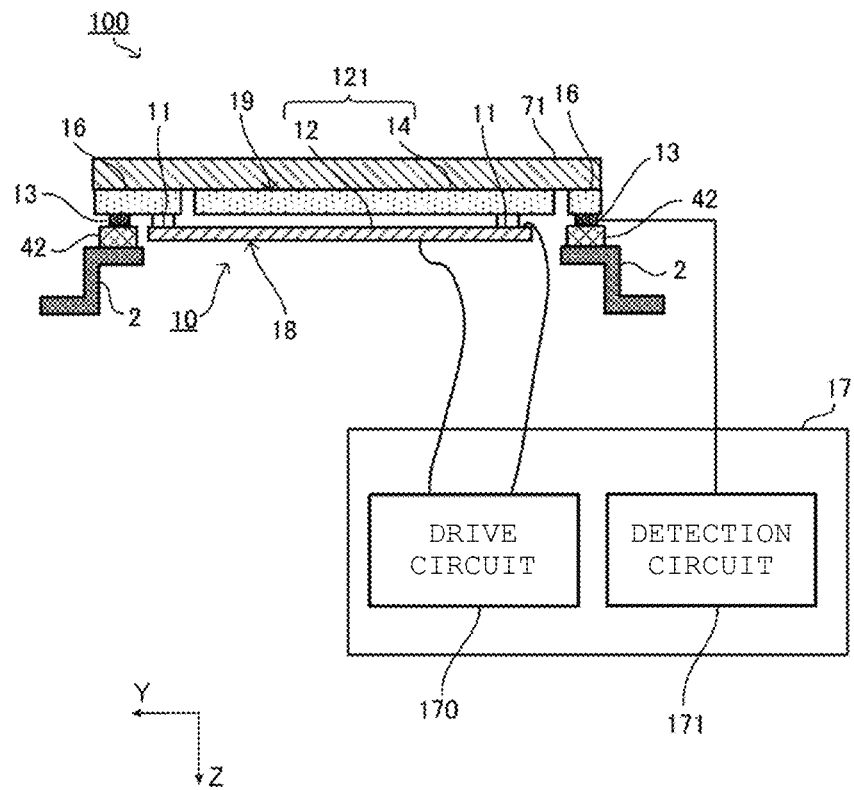
FIG. 1 is a schematic view illustrating a configuration of a vibration device 100.
Figure 2:
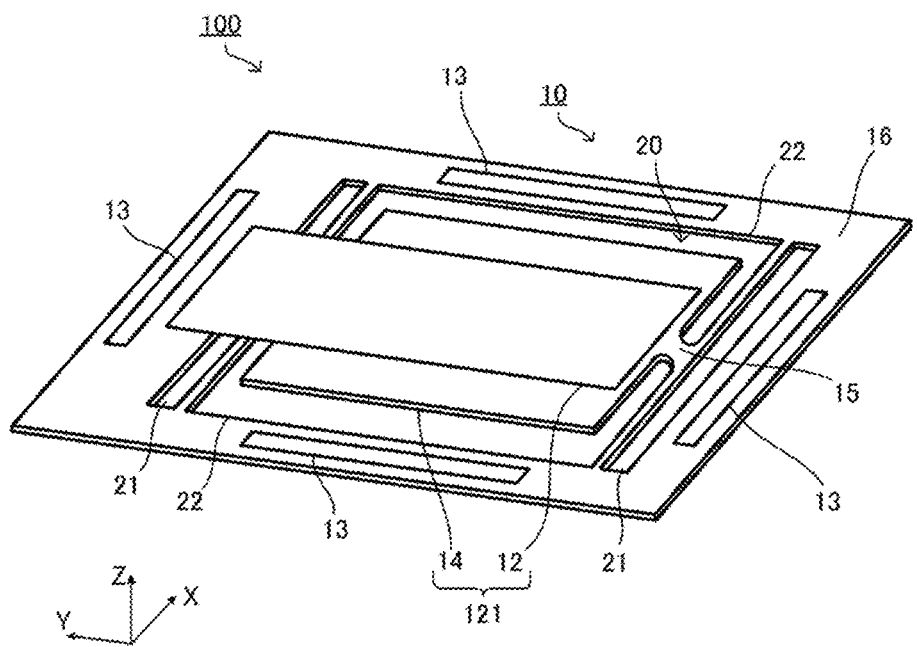
FIG. 2 is a perspective view of the vibration device 100.
Figure 3:
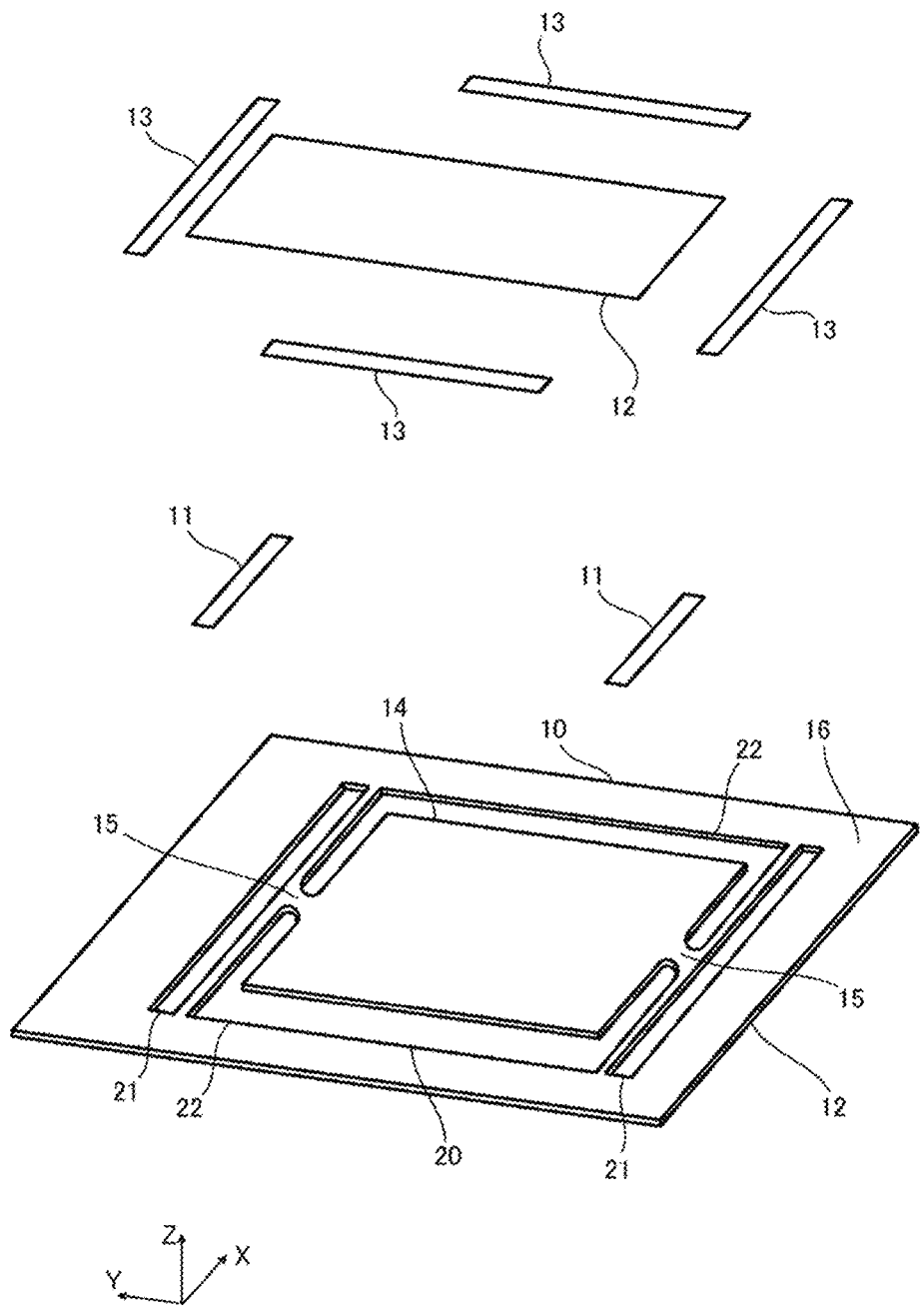
FIG. 3 is an exploded perspective view of the vibration device 100.
Figure 4A:
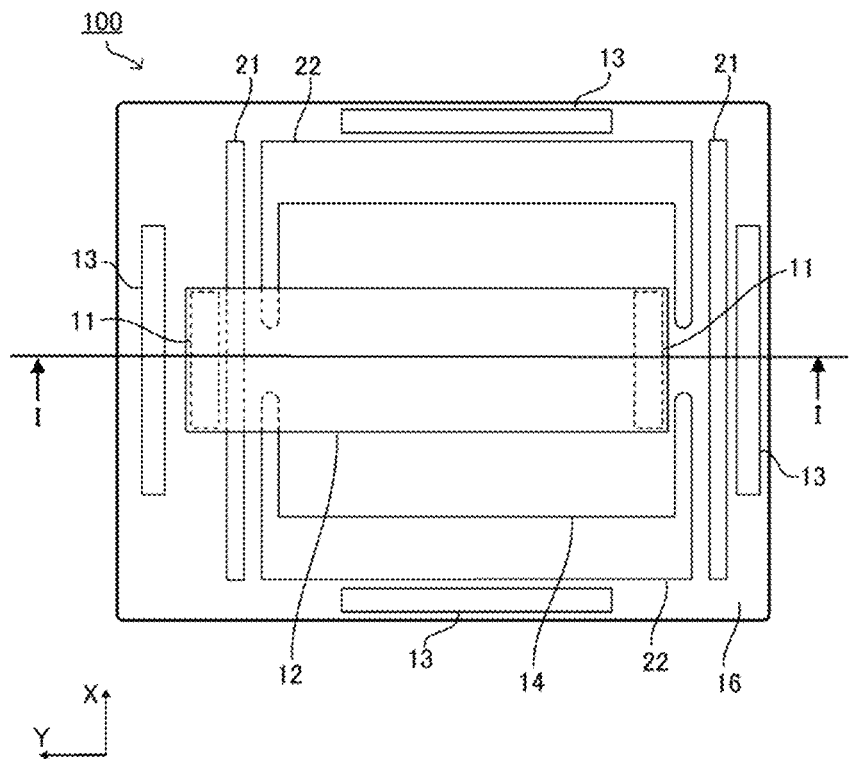
FIG. 4(A) is a plan view of the vibration device 100.
Figure 4B:
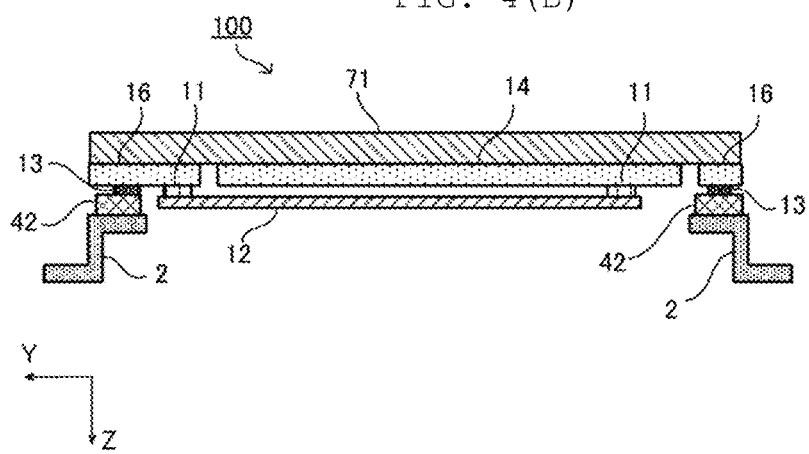
FIG. 4(B) is a sectional view taken along line I-I illustrated in FIG. 4(A).

FIG. 1 is a schematic view illustrating a configuration of a vibration device 100 according to a first embodiment. FIG. 1 is a sectional view of a part of the vibration device 100. FIG. 2 is a perspective view illustrating an example of the vibration device 100 viewed from the rear side. FIG. 3 is an exploded perspective view of the vibration device 100 viewed from the rear side. FIG. 4(A) is a plan view of the vibration device 100 viewed from the rear side, and FIG. 4(B) is a sectional view taken along line I-I illustrated in FIG. 4(A). Note that FIG. 4(B) illustrates a state in which the vibration device 100 is installed in a housing 2. In FIG. 4(A), the housing 2 and a cushion material 42 are omitted. In addition, in each figure other than FIG. 1, a circuit 17 and wirings are omitted.

As illustrated in FIG. 1, the vibration device 100 of the present embodiment includes a vibration unit 10, a sensor 13, the circuit 17, and a touch panel 71. The circuit 17 includes a drive circuit 170 and a detection circuit 171. The vibration unit 10 and the sensor 13 will be described in detail later. The vibration unit 10 is connected to the drive circuit 170, and the sensor 13 is connected to the detection circuit 171. The touch panel 71 has a flat plate shape and accepts a user's touch operation. The touch panel 71 is arranged on a second main surface 19 side of the vibration unit 10, and is connected by an adhesive or the like (not illustrated).

As illustrated in FIG. 4(B), the vibration device 100 is installed in the housing 2 of electronic equipment or the like. The vibration device 100 is connected to the housing 2 with the cushion material 42 interposed therebetween. The cushion material 42 is formed of a material that is easily deformed when receiving the external force more than the housing 2 and the vibration unit 10. The cushion material 42 absorbs the deformation on the housing 2 side. Therefore, it becomes difficult for the deformation on the housing 2 side to be transmitted to the sensor 13. Accordingly, the cushion material 42 can suppress unnecessary deformation of the sensor 13.

As illustrated in FIGS. 2, 3, and 4(A), the vibration unit 10 has a connection member 11, a vibration film 12, a vibrating portion 14, a support portion 15, and a frame-shaped member 16. The vibration unit 10 has a first main surface 18 and the second main surface 19. In the present embodiment, the vibrating portion 14 and the vibration film 12 constitute a vibrator 121.

The frame-shaped member 16 has a rectangular shape in the plan view. The frame-shaped member 16 has an opening 20 having a rectangular shape. The frame-shaped member 16 has two first openings 21 and two second openings 22. The first openings 21 are arranged at both ends of the frame-shaped member 16 in a Y direction as the longitudinal direction. The second openings 22 are arranged at both ends of the frame-shaped member 16 in an X direction as the lateral direction. In this example, the opening 20 includes two second openings 22. The first opening 21 has a substantially rectangular shape, and has a shape that is long along the X direction. The second opening 22 is an opening having a substantially rectangular shape that is long along the Y direction. Further, both ends of the second opening 22 in the Y direction further extend in a rectangular shape toward the central axis (I-I line in the drawing) of the frame-shaped member 16.

The vibrating portion 14 has a rectangular shape in the plan view, and is arranged inward of the opening 20. The area of the vibrating portion 14 is smaller than the area surrounded by the opening 20, that is, the second openings 22.

The support portion 15 connects the vibrating portion 14 and the frame-shaped member 16. The support portion 15 supports the vibrating portion 14 on the frame-shaped member 16. In this example, the support portion 15 has a rectangular shape that is long along the X direction, and holds the vibrating portion 14 at both ends of the vibrating portion 14 in the Y direction. The length of the support portion 15 in the X direction orthogonal to the Y direction in which the vibration film 12 expands and contracts is longer than the length of the support portion 15 in the Y direction.

The frame-shaped member 16, the vibrating portion 14, and the support portion 15 are formed of the same member (for example, acrylic resin, PET, polycarbonate, glass epoxy, FRP, metal, glass, or the like). Examples of the metal include stainless steel material (SUS), and the metal may be insulated by coating with a resin such as polyimide, if necessary.

The frame-shaped member 16, the vibrating portion 14, and the support portion 15 are formed by performing punching processing on a single plate member, which has a rectangular shape, along the shapes of the first openings 21 and the second openings 22. The frame-shaped member 16, the vibrating portion 14, and the support portion 15 may be formed of different members, but can be easily manufactured by being formed of the same member. Alternatively, by the frame-shaped member 16, the vibrating portion 14, and the support portion 15 being formed of the same member, it is not necessary to use another member (member having creep deterioration) such as rubber for supporting the vibrating portion 14, and it is possible to stably hold the vibrating portion 14 for a long period of time.

As illustrated in FIGS. 3 and 4(B), the vibration film 12 is connected to the first main surface 18 side of the vibration unit 10. More specifically, the vibration film 12 is connected to the frame-shaped member 16 and the vibrating portion 14 with the connection member 11 interposed therebetween. A first end of the vibration film 12 in the longitudinal direction is connected to a first end of the frame-shaped member 16 in the Y direction. A second end of the vibration film 12 is connected to a second end of the vibrating portion 14 in the Y direction. The connection member 11 is made of an insulating and adhesive material. The vibration film 12 is connected to the frame-shaped member 16 with the connection member 11 interposed therebetween, for example, by heat welding.

The connection member 11 has a rectangular shape that is long along the lateral direction of the frame-shaped member 16 in the plan view. The connection member 11 has a certain thickness, and connects the vibration film 12 and the vibrating portion 14 with a certain distance such that the vibration film 12 does not come into contact with the vibrating portion 14. As a result, the electrodes (not illustrated) provided on both main surfaces of the vibration film 12 do not come into contact with the vibrating portion 14, so that even if the vibration film 12 expands and contracts and the vibrating portion 14 vibrates, the electrodes can be prevented from being scraped.

The vibration film 12 is an example of a film that vibrates by being deformed in the plane direction when a voltage is applied. The vibration film 12 has a rectangular shape that is long along the longitudinal direction of the frame-shaped member 16 in the plan view. The vibration film 12 is made of, for example, polyvinylidene fluoride (PVDF). Further, the vibration film 12 may be made of a chiral polymer. As the chiral polymer, for example, poly-L-lactide (PLLA) or poly-D-lactide (PDLA) is used.

In a case where PVDF is used for the vibration film 12, since PVDF has water resistance, it is possible to cause electronic equipment including the vibrating member in this example to vibrate similarly under any humidity environment.

In addition, in a case where PLLA is used for the vibration film 12, since PLLA is a highly transmissive material, if the electrodes and the vibrating portion 14 to be added to PLLA are transparent materials, the internal state of the equipment can be visually recognized, and thus manufacturing becomes easy. Further, since PLLA has no pyroelectricity, it is possible to cause the vibration film to vibrate similarly under any temperature environment. For example, in a case where the vibration film 12 is made of PLLA, the vibration film 12 has piezoelectricity by being cut such that each outer periphery is approximately 45° with respect to the stretching direction.

The drive circuit 170 applies a voltage to the vibration film 12 to cause the vibration film 12 to expand and contract. The vibration film 12 is deformed in the plane direction when a voltage is applied. Specifically, the vibration film 12 expands and contracts in the Y direction when a voltage is applied. When the vibration film 12 expands and contracts in the longitudinal direction, the vibrating portion 14 vibrates in the Y direction. That is, the vibrator 121 vibrates in the Y direction. As a result, the vibration generated by the vibration film 12 is transmitted to the user through the vibrating portion 14.

The vibration device 100 includes four sensors 13. The sensors 13 are sensors that detect a pressing operation in a Z direction, which is a direction normal to a pressing surface of the vibration unit 10. The sensors 13 are connected to the first main surface 18 side of the vibration unit 10. The sensors 13 are arranged around the vibrator 121 in the vibration unit 10 in the plan view. That is, the four sensors 13 are arranged on the frame-shaped member 16.

Two of the four sensors 13 are arranged at both ends of the frame-shaped member 16 in the Y direction as the longitudinal direction. That is, the two sensors 13 are arranged closer to the end portion sides of the frame-shaped member 16 than the first openings 21. The two sensors 13 have a substantially rectangular shape, and have a shape that is long along the X direction. The other two of the four sensors 13 are arranged at both ends of the frame-shaped member 16 in the X direction as the lateral direction. That is, the other two sensors 13 are arranged closer to the end portion sides of the frame-shaped member 16 than the second openings 22. The other two sensors 13 have a substantially rectangular shape, and have a shape that is long along the Y direction. In this way, the vibrator 121 and the four sensors 13 do not overlap in the X-Y plane in the plan view.

Figure 5:
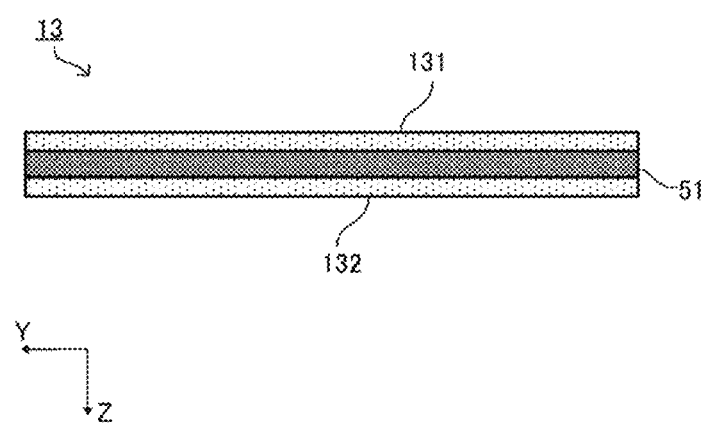
FIG. 5 is a sectional view of a structure of a sensor 13.

FIG. 5 is a sectional view illustrating the structure of the sensor 13 in detail. As illustrated in FIG. 5, the sensor 13 includes a piezoelectric film 51. A first electrode 131 and a second electrode 132 are formed on both main surfaces of the piezoelectric film 51. The first electrode 131 and the second electrode 132 are formed on the piezoelectric film 51, for example, by a vapor deposition method.

Each of the first electrode 131 and the second electrode 132 of each of the four sensors 13 are connected to the detection circuit 171. Each sensor 13 and the detection circuit 171 form a press detection unit.

The piezoelectric film 51 is made of a piezoelectric material having a large piezoelectric constant d33. For example, the piezoelectric film 51 is PVDF. In this case, the piezoelectric film 51 is polarized by expansion and contraction in the Z direction orthogonal to the first electrode 131 and the second electrode 132. When the user performs a pressing operation in the Z direction on the vibration device 100, the piezoelectric film 51 expands and contracts in the Z direction. The detection circuit 171 inputs the potential difference between the first electrode 131 and the second electrode 132 generated by the piezoelectric film 51 through the first electrode 131 and the second electrode 132. As a result, the detection circuit 171 detects the pressing operation.

The sensor 13 is not limited to the configuration using the piezoelectric film 51 having a piezoelectric constant d33 such as PVDF. As the sensor 13, for example, a resistance change type pressure sensor may be used.

When the user applies a pressing operation to the touch panel 71, force along the Z direction is applied to the sensor 13 connected to the touch panel 71. The vibrator 121 is located at a position where the vibrator 121 does not overlap with the four sensors 13 in the plan view. When the touch panel 71 accepts the pressing operation, the force of the pressing operation is not transmitted to the position where the vibrator 121 is located. That is, even if the user pushes the touch panel 71 in the Z direction, the vibrator 121 at the center is not pushed in the Z direction. Therefore, the vibrator 121 can vibrate without being affected by the user's pressing operation. Accordingly, the sensor 13 can detect the deformation in the Z direction without inhibiting the vibration of the vibrator 121.

Figure 6A:
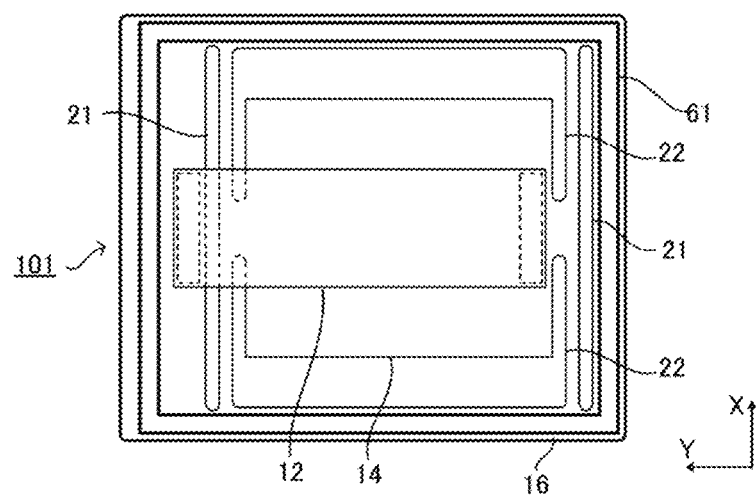
FIGS. 6(A) to 6(C) are diagrams for describing modification examples of the vibration device 100.
Figure 6B:
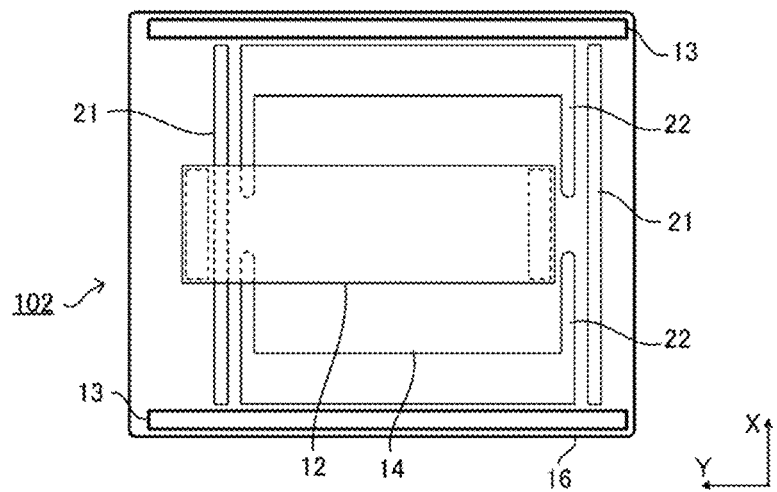
Figure 6C:
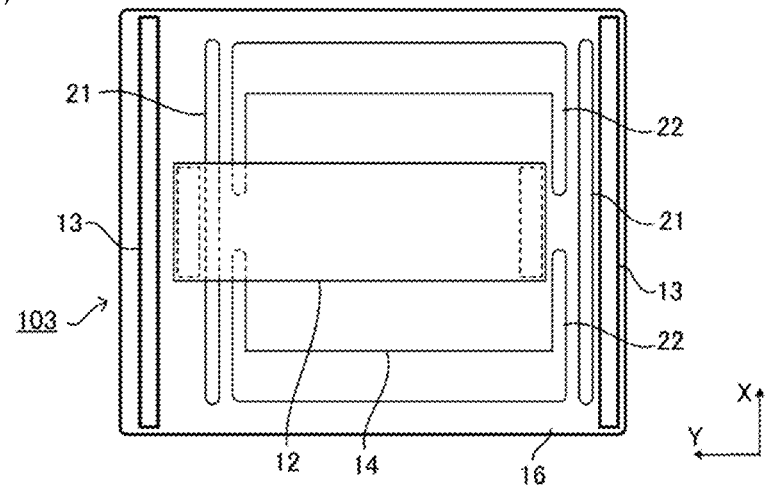

FIGS. 6(A) to 6(C) are diagrams for describing Modification Examples 1 to 3 of the vibration device 100, and plan views of vibration devices 101 to 103 according to Modification Examples 1 to 3. In the description of Modification Examples 1 to 3, only the parts different from the above-described embodiment will be described, and the rest will be omitted.

As illustrated in FIG. 6(A), the vibration device 101 according to Modification Example 1 includes an annular sensor 61 that surrounds the periphery of the vibrator 121. That is, the sensor 61 is present in any direction around the vibrator 121. Since the sensor 61 is present in such a wide range, the vibration device 101 can detect the pressing operation even if the user pushes a portion in any direction around the vibrator 121 in the Z direction. Further, in a case where the user presses a plurality of portions on the vibration device 101 at the same time, a larger output can be obtained by adding the detected voltage values.

As illustrated in FIG. 6(B), the vibration device 102 according to Modification Example 2 includes two sensors 13. The two sensors 13 have a shape that extend along the Y direction. The two sensors 13 are arranged only at both ends of the frame-shaped member 16 in the X direction as the lateral direction. Accordingly, the vibration device 102 can detect the pressing operation only in a case where the user pushes both ends of the vibration device 102 in the X direction.

As illustrated in FIG. 6(C), the vibration device 103 according to Modification Example 3 includes two sensors 13. The two sensors 13 have a shape that extend along the X direction. The two sensors 13 are arranged only at both ends of the frame-shaped member 16 in the Y direction as the longitudinal direction. Accordingly, the vibration device 103 can detect the pressing operation only in a case where the user pushes both ends of the vibration device 103 in the Y direction.

Figure 7A:
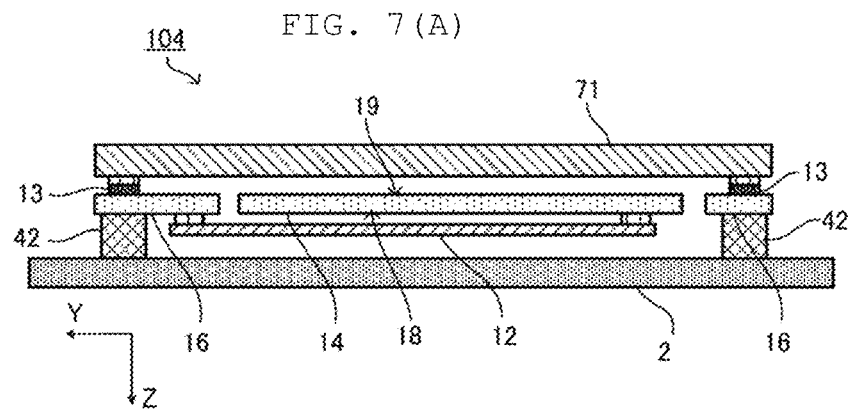
FIGS. 7(A) and 7(B) are diagrams for describing modification examples of the vibration device 100.
Figure 7B:
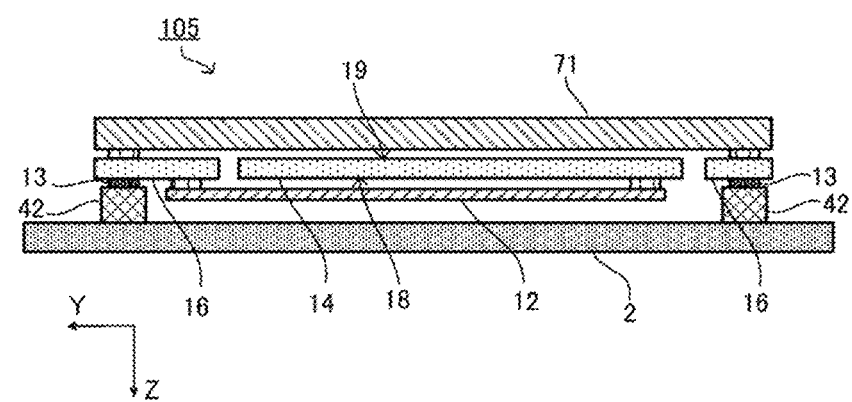

FIGS. 7(A) and 7(B) are diagrams for describing Modification Examples 4 and 5 of the vibration device 100, and plan views of vibration devices 104 and 105 according to Modification Examples 4 and 5. In the description of Modification Example 4, only the parts different from the above-described embodiment will be described, and the rest will be omitted. In the description of Modification Example 5, only the parts different from Modification Example 4 will be described, and the rest will be omitted.

As illustrated in FIG. 7(A), in the vibration device 104 according to Modification Example 4, the touch panel 71 is arranged on the second main surface 19 side of the vibration unit 10. The sensor 13 is connected to the second main surface 19 side of the vibration unit 10. The touch panel 71 is connected to the frame-shaped member 16 of the vibration unit 10 with the sensor 13 and the connection member 11 interposed therebetween. the vibrator 121 is connected to the first main surface 18 side of the vibration unit 10. In such a configuration, the sensor 13 and the touch panel 71 can be easily arranged on the frame-shaped member 16 later.

The touch panel 71 may be connected to the detection circuit 171 of the circuit 17. The touch panel 71 and the detection circuit 171 constitute a touch detection unit. The touch panel 71 is provided at a position corresponding to, for example, a key layout, and the detection circuit 171 detects the user's touch operation. The touch detection unit may be of any type as long as it has a function of detecting the user's touch operation, and various methods such as a membrane type, a capacitance type, or a piezoelectric film type can be used.

When the user touches the touch panel 71, the detection circuit 171 detects the user's touch operation. For example, when the detection circuit 171 detects a touch operation, the drive circuit 170 applies a drive signal to the vibration film 12 to cause the vibrating portion 14 to vibrate. As a result, since the vibrating portion 14 vibrates when the user presses the touch panel 71, the vibration is transmitted to the touch panel 71 to make the user feel that he/she has "pressed" the key.

As illustrated in FIG. 7(B), the vibration device 105 according to Modification Example 5 is the same as the vibration device 104 according to Modification Example 4 except that the sensor 13 is arranged on the first main surface 18 side of the vibration unit 10. Since the sensor 13 is arranged on the first main surface 18 side which is the same side where the vibration film 12 is arranged, it is less bulky than the vibration device 104. Accordingly, the vibration device 105 can be formed thinner than the vibration device 104.

An example in which the sensor 13 is arranged at four places in the present embodiment, is arranged at two places in Modification Examples 2 and 3 has been described, but the present invention is not limited thereto. The sensor 13 may be arranged at only one place or at three places. Further, the sensor 13 may be arranged at two places so as to sandwich the same corner. In addition, a plurality of sensors 13 may be provided on the same side of the frame-shaped member 16.

Further, the sensor 13 may be a single layer or may be stacked. In particular, by increasing the number of layers to be stacked, the output from each sensor 13 can be added, so that a larger output can be obtained.

Figure 8:
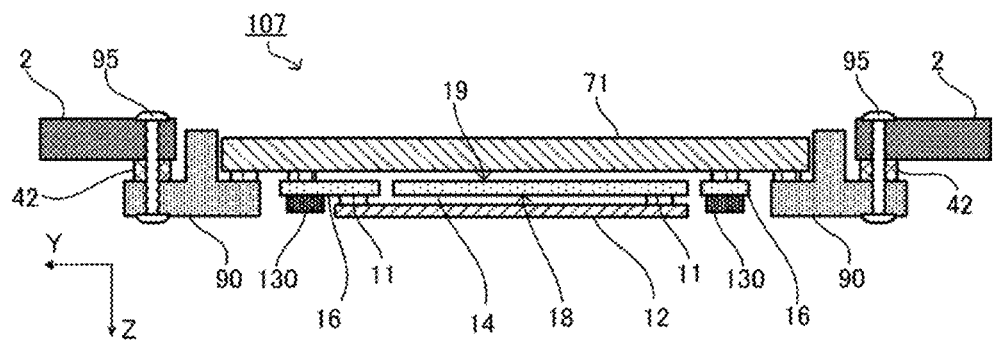
FIG. 8 is a sectional view of a vibration device 107 according to Modification Example 6.

Next, FIG. 8 is a sectional view of a vibration device 107 according to Modification Example 6. In the vibration device 107, a sensor 130 is arranged on the first main surface 18 side of the frame-shaped member 16. The touch panel 71 is connected to the second main surface 19 of the frame-shaped member 16 using an adhesive. The touch panel 71 is connected to a holder 90 using an adhesive, on the outer side of the frame-shaped member 16. The holder 90 is a member for connecting the touch panel 71 to the housing 2. The holder 90 is a plate-shaped member having an opening at the center. The area of the opening is slightly smaller than that of the touch panel 71. The touch panel 71 is placed on and is connected to the inner peripheral edge portion of the holder 90 using an adhesive, at the edge.

The holder 90 is connected to the housing 2 at the outer peripheral edge portion. The cushion material 42 is arranged between the housing 2 and the holder 90. The housing 2 and the holder 90 are firmly connected by screws 95.

Further, the holder 90 has a convex portion protruding along the Z direction. The convex portion is arranged on the outer periphery of the touch panel 71 in the plan view. The height of the convex portion is almost the same as or slightly higher than the upper surface of the touch panel 71.

When the user applies the pressing operation to the touch panel 71, the touch panel 71 is bent. When the touch panel 71 is bent, the vibration unit 10 is also bent, and the frame-shaped member 16 is also bent. The sensor 130 connected to the first main surface 18 is also bent.

The sensor 130 has the same structure as that illustrated in FIG. 5. However, the piezoelectric film 51 is made of polylactide or PVDF having a large piezoelectric constant d31. That is, the sensor 130 of Modification Example 6 detects the bending deformation. In a case where the piezoelectric film 51 is polylactide, the piezoelectric film 51 is arranged such that the uniaxial stretching direction forms an angle of 45 degrees with respect to the X direction and the Y direction.

The vibration device 107 of Modification Example 6 can detect the pressing operation on the touch panel 71 by detecting the bending deformation. Therefore, it is not necessary to arrange a rigid body such as the housing 2, on the lower surface side of the sensor 130. As a result, the thickness of the vibration device can be reduced.

Figure 9:
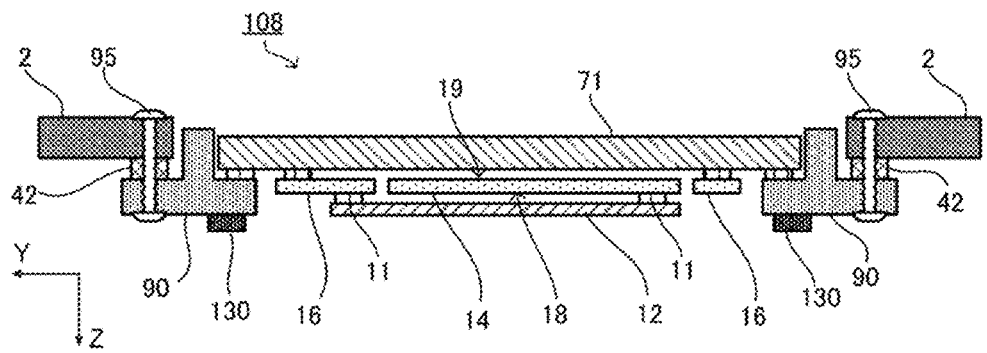
FIG. 9 is a sectional view of a vibration device 108 according to Modification Example 7.

Next, FIG. 9 is a sectional view of a vibration device 108 according to Modification Example 7. The same reference numerals are given to the same configurations as in FIG. 8. In the vibration device 108, the sensor 130 is arranged on the lower surface of the holder 90. The sensor 130 is arranged between the convex portion and the inner peripheral edge of the holder 90 in the plan view.

The touch panel 71 is connected to the inner peripheral edge portion of the holder 90. Therefore, when the user applies a pressing operation to the touch panel 71, the pressing force is applied to the position of the holder 90 connected to the touch panel 71. As a result, the inner peripheral edge side of the holder 90 is bent, and the bending deformation is generated in the holder 90. Therefore, the sensor 130 detects the pressing operation on the touch panel 71.

In the vibration device 108 of Modification Example 7, the sensor 130 is not arranged in the vibration unit 10. Therefore, the vibration of the vibration unit 10 is difficult to be transmitted to the sensor 130. Therefore, the vibration device 108 can prevent erroneous detection of the sensor 130.

Figure 10:
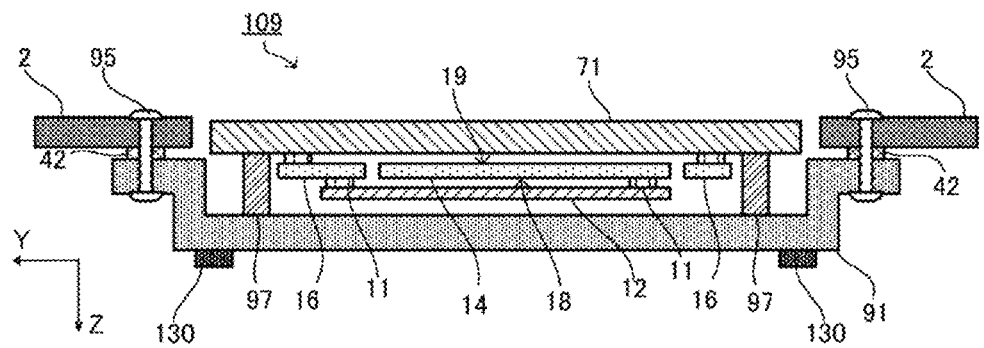
FIG. 10 is a sectional view of a vibration device 109 according to Modification Example 8.

Next, FIG. 10 is a sectional view of a vibration device 109 according to Modification Example 8. The same reference numerals are given to the same configurations as in FIG. 9. In the vibration device 109, the touch panel 71 is connected to a holder 91 with a connection member 97 interposed therebetween, on the outer side of the frame-shaped member 16. The holder 91 is different from the holder 90 in that the holder 91 does not have an opening at the central portion and that the central portion is recessed in the Z direction.

When the user applies a pressing operation to the touch panel 71, the pressing force is applied to the portion of the holder 91 connected to the touch panel 71 with the connection member 97 interposed therebetween. As a result, the recessed portion of the holder 91 is bent to cause the bending deformation. The sensor 130 is arranged between the connection portion of the connection member 97 and the outer peripheral edge of the recessed portion of the holder 91 in the plan view. That is, the sensor 130 is arranged at a portion where the holder 91 is bent when the touch panel 71 is bent. Therefore, the sensor 130 detects the pressing operation on the touch panel 71.

Figure 11:
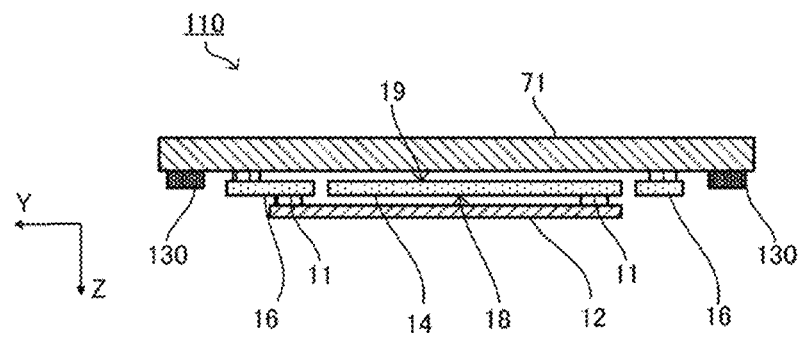
FIG. 11 is a sectional view of a vibration device 110 according to Modification Example 9.

FIG. 11 is a sectional view of a vibration device 110 according to Modification Example 9. In this example, the sensor 130 is connected to the touch panel 71. The touch panel 71 is fixed to the housing 2 (not illustrated). The sensor 130 performs an output according to the bending of the touch panel 71. Therefore, the sensor 130 detects the pressing operation on the touch panel 71.

By directly attaching the sensor 130 to the touch panel 71, the vibration device 110 of Modification Example 9 can be made thinner than a case in which the sensor 130 is attached to the vibration unit 10.

Figure 12:
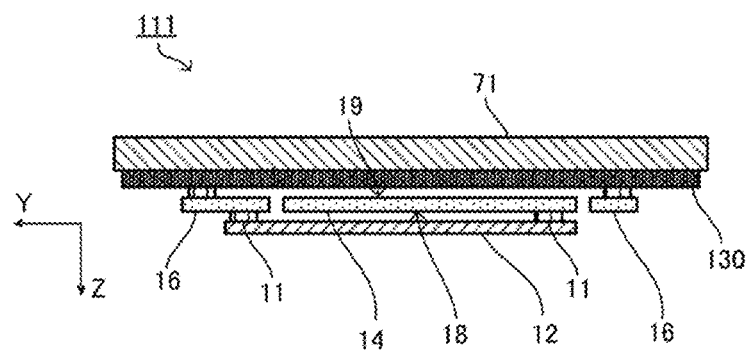
FIG. 12 is a sectional view of a vibration device 111 according to Modification Example 10.

FIG. 12 is a sectional view of a vibration device 111 according to Modification Example 10. In this example, the sensor 130 is connected to the entire surface of the touch panel 71. The vibration unit 10 is connected to the lower surface of the sensor 130. In this case, the sensitivity of the sensor 130 can be increased.

Further, the touch panel 71 is provided with a capacitance sensor. Therefore, the sensor 130 can be stacked in the touch panel 71.

The touch panel 71 may be further stacked on a display. Therefore, the sensor 130 may be stacked on the capacitance sensor and the display. The sensor 130 may be stacked on the lower surface side of the display, or may be arranged on the upper surface side of the display in a case where a highly transparent material such as polylactide is used for the piezoelectric film 51.

Figure 13:
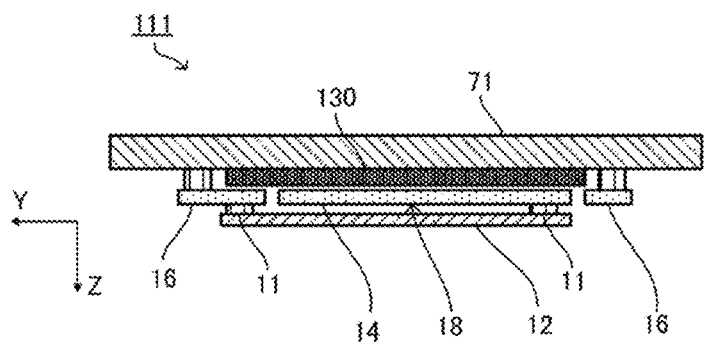
FIG. 13 is a sectional view of the vibration device 111 according to Modification Example 10.

Further, as illustrated in FIG. 13, the sensor 130 may be arranged inward of the connection portion between the vibration unit 10 and the touch panel 71 in the plan view. In this case, the vibration device 111 becomes thinner by the thickness of the sensor 130.

Finally, the description of the present embodiment is illustrative in all aspects and should be considered as non-limiting. The scope of the present invention is indicated by the claims, rather than the above-described embodiment. Further, the scope of the present invention is intended to include all modifications within the meaning and scope equivalent to the claims.

DESCRIPTION OF REFERENCE SYMBOLS

2: Housing
10: Vibration unit 11 Connection member
12: Vibration film
13, 61, 130: Sensor
14: Vibrating portion
15: Support portion
16: Frame-shaped member
17: Circuit
18: First main surface
19: Second main surface
20: Opening
21: First opening
22: Second opening
42: Cushion material
51: Piezoelectric film
71: Touch panel
90, 91: Holder
91: Holder
95: Screw
97: Connection member
100, 101, 102, 103, 104, 105, 107, 108, 109, 110, 111: Vibration device
121: Vibrator
131: First electrode
132: Second electrode
170: Drive circuit
171: Detection circuit

The invention claimed is:

1. A vibration device comprising:
a vibration unit that has a vibrator which vibrates in a plane direction; and
a sensor arranged on at least a portion of the vibration unit around the vibrator in a plan view of the vibration unit, and the sensor is constructed to detect a pressing operation in a direction normal to a pressing surface of the vibration device.

2. The vibration device according to claim 1, wherein the sensor includes a piezoelectric film.

3. The vibration device according to claim 2, wherein the piezoelectric film has a piezoelectric constant d33.

4. The vibration device according to claim 3, wherein the piezoelectric film is PVDF.

5. The vibration device according to claim 2, wherein the piezoelectric film is PVDF.

6. The vibration device according to claim 1, wherein the sensor surrounds a periphery of the vibrator in the plan view.

7. The vibration device according to claim 1, wherein the sensor includes two portions, each of which being arranged on opposed sides of the vibrator in the plan view.

8. The vibration device according to claim 1, wherein the vibration unit has a first main surface and a second main surface, and includes a vibration film constructed to deform in the plane direction to cause the vibrator to vibrate, and the vibration film is arranged on a side of the first main surface of the vibration unit, and
the sensor is arranged on the side of the first main surface of the vibration unit.

9. The vibration device according to claim 1, wherein the vibration unit has a first main surface and a second main surface, and includes a vibration film constructed to deform in the plane direction to cause the vibrator to vibrate, and the vibration film is arranged on a side of the first main surface of the vibration unit, and
the sensor is arranged on a side of the second main surface of the vibration unit.

10. The vibration device according to claim 1, wherein the vibration unit has a first main surface and a second main surface, and includes a vibration film constructed to deform in the plane direction to cause the vibrator to vibrate, and the vibration film is arranged on a side of the first main surface of the vibration unit, and
the vibration device further includes a touch panel that is arranged on a side of the second main surface of the vibration unit, the touch panel having the pressing surface and constructed to accept the pressing operation.

11. The vibration device according to claim 1, further comprising a touch panel that is arranged on a side of the vibration unit, the touch panel having the pressing surface and constructed to accept the pressing operation.

12. The vibration device according to claim 11, wherein the vibration unit has a first main surface and a second main surface, and includes a vibration film constructed to deform in the plane direction to cause the vibrator to vibrate, and the vibration film is arranged on a side of the first main surface of the vibration unit, and
the sensor is arranged on the side of the first main surface of the vibration unit.

13. The vibration device according to claim 11, wherein the vibration unit has a first main surface and a second main surface, and includes a vibration film constructed to deform in the plane direction to cause the vibrator to vibrate, and the vibration film is arranged on a side of the first main surface of the vibration unit, and
the sensor is arranged on a side of the second main surface of the vibration unit.

14. The vibration device according to claim 11, further comprising a holder configured to connect to a housing, the touch panel being connected to the holder.

15. The vibration device according to claim 14, wherein the vibration unit has a first main surface and a second main surface, and includes a vibration film constructed to deform in the plane direction to cause the vibrator to vibrate, and the vibration film is arranged on a side of the first main surface of the vibration unit, and
the sensor is arranged on the side of the first main surface of the vibration unit.

* * * * *